United States Patent
Sumiya et al.

(10) Patent No.: US 6,239,005 B1
(45) Date of Patent: May 29, 2001

(54) METHOD OF FORMING EPITAXIALLY GROWN SEMICONDUCTOR LAYER ON METAL LAYER AND LIGHT EMITTING SEMICONDUCTOR DEVICE COMPRISING SAID SEMICONDUCTOR LAYER

(75) Inventors: Masatomo Sumiya, Hamamatsu; Mamoru Yoshimoto, Sagamihara; Shunro Fuke, Hamamatsu, all of (JP)

(73) Assignee: Shizuoka University, Shizouka (JP)

( * ) Notice: Subject to any disclaimer, the term of this patent is extended or adjusted under 35 U.S.C. 154(b) by 0 days.

(21) Appl. No.: 09/275,453

(22) Filed: Mar. 24, 1999

(30) Foreign Application Priority Data

Mar. 25, 1998 (JP) .................................................. 10-077140

(51) Int. Cl.[7] .................................................. H01L 21/36
(52) U.S. Cl. .......................... 438/479; 438/686; 438/46; 438/105
(58) Field of Search .............................. 438/46, 47, 105, 438/479, 650, 686

(56) References Cited

U.S. PATENT DOCUMENTS 5,889,295 * 3/1999 Rennie et al. .......................... 257/96
6,045,626 * 4/2000 Yano et al. .......................... 148/33.4

FOREIGN PATENT DOCUMENTS

410321956A * 12/1998 (JP) .
411354817 * 12/1999 (JP) .

* cited by examiner

Primary Examiner—Eddie C. Lee
Assistant Examiner—N. Drew Richards
(74) Attorney, Agent, or Firm—Stevens, Davis, Miller & Mosher, LLP

(57) ABSTRACT

In a method of forming a single crystal semiconductor directly on a metal layer, a metal layer is epitaxially grown on a surface an electrically insulating substrate having a single crystal structure, and a single crystal semiconductor layer is epitaxially grown on the metal layer. Particularly, on a c-face of a sapphire substrate, a platinum layer is epitaxially grown in a crystal orientation of (111) by sputtering, while the sapphire substrate is heat at about 400–700° C. After annealing at 600–900° C., a buffer layer made of gallium nitride is epitaxially grown on the platinum layer with a thickness of 500–2000 Å by MOVPE, while the sapphire substrate is heated at about 600° C. Finally, a single crystal gallium nitride layer is epitaxially grown on the buffer layer by MOVPE, while the sapphire substrate is heated at about 1000° C.

16 Claims, 3 Drawing Sheets

METHOD OF FORMING EPITAXIALLY GROWN SEMICONDUCTOR LAYER ON METAL LAYER AND LIGHT EMITTING SEMICONDUCTOR DEVICE COMPRISING SAID SEMICONDUCTOR LAYER

BACKGROUND OF THE INVENTION

1. Field of the Invention

The present invention relates to a method of forming a metal-semiconductor layered structure provided on an electrically insulating substrate, and also relates to a light emitting semiconductor device including such a layered structure.

2. Description of the Related Art

Heretofore, there has been earnestly required to develop a practically usable blue light emitting semiconductor laser formed by a basic material of gallium nitride (GaN). FIG. 1 is a schematic view showing a known semiconductor laser formed by a basic material of gallium nitride. It is impossible or practically difficult to obtain a single crystal wafer of gallium nitride, and therefore use is made of a sapphire substrate 1, and a thin buffer layer 2 of gallium nitride 2 is formed on the sapphire substrate 1, a first cladding layer 3 formed by a thick n-type gallium nitride layer having a thickness of about 3 μm is deposited on the buffer layer 2, an active layer 4 is formed on the first cladding layer 3, a second p-type cladding layer 5 is formed on the active layer 4, and a p-electrode 6 is formed on the second cladding layer 5. A part of a corner of such an assembly is removed by a suitable patterning treatment to expose a part of the first cladding layer 3, and an n-electrode 7 is formed on the thus exposed surface of the first cladding layer.

In such a known semiconductor laser, a current path is formed from the n-electrode 7 to the p-electrode 6 via the first cladding layer 3, active layer 4 and second cladding layer. In the known semiconductor laser, since the n-electrode 7 is provided on the exposed surface of the corner portion of the first cladding layer 3, carriers introduced from the n-electrode travel laterally along the exposed surface and then arrive at the active layer 4. Therefore, the carrier travelling path becomes longer and has a relatively high electric resistance, and thus a substantial amount of electric power is consumed therein. This also causes an increase in an operating voltage.

Moreover, in order to provide the n-electrode 7, the assembly of the first and second cladding layers 3 and 5 and active layer 4 has to be partially removed by any suitable patterning process and the manufacturing process is liable to be complicated and through-put is decreased.

The above mentioned problems of the known semiconductor laser could be completely removed if a metal layer serving as an electrode is first formed on an insulating substrate and then a single crystal semiconductor layer is formed directly on the metal layer. In such a structure, carriers introduced from the electrode could be efficiently supplied to the active layer through a thin cladding layer, and therefore an electric resistance of the carrier travelling path could be materially lowered.

Not only the above mentioned semiconductor laser, but also in solar cell and photo-detector, the above structure of the substrate-metal layer-semiconductor layer has been widely used, and thus if the single crystal semiconductor layer could be formed directly on the metal layer formed on the insulating substrate, an efficiency of the device and manufacturing process could be improved to a great extent.

However, it has not been proposed any practical method of forming a semiconductor layer directly on a metal layer formed on an electrically insulating substrate.

SUMMARY OF THE INVENTION

The present invention has for its object to provide a novel and useful method of forming a single crystal semiconductor layer directly or via a very thin buffer layer on a metal layer formed on an electrically insulating substrate.

It is another object of the invention to provide a light emitting semiconductor device, in which a power consumption can be reduced and an operating voltage can be lowered.

According to the invention, a method of forming a single crystal semiconductor layer on a metal layer comprises the steps of:

preparing an electrically insulating substrate having a single crystal structure;

forming an epitaxially grown metal layer on a surface of said electrically insulating substrate; and forming an epitaxially grown semiconductor layer by epitaxial growth on a surface of said metal layer.

The inventors have conducted various experiments and analyses about the metal-semiconductor structure, and have found that when a metal layer is deposited in a direction of a given crystallographic axis on a predetermined crystal surface of an electrically insulating substrate having a single crystal structure, it is possible to obtain an epitaxially grown metal layer, i.e. a single crystal metal layer. Therefore, by epitaxially growing a semiconductor layer on such an epitaxially grown metal layer, it is also possible to obtain a single crystal semiconductor layer. The present invention is based on such a recognition resulted from the experiments and analysis. That is to say, according to the invention, on a single crystal substrate is formed an epitaxially grown metal layer, and then a single crystal semiconductor layer is epitaxially grown on such a metal layer. In this manner, according to the invention, the single crystal semiconductor layer can be directly formed on the metal layer. Therefore, in a semiconductor device, a metal electrode layer is formed on the substrate, and then a single crystal semiconductor layer is directly or via a buffer layer formed on the metal electrode layer. In this manner, according to the invention, a semiconductor device including the metal-semiconductor layered structure can be manufactured in an efficient manner. That is to say, according to the invention, a single crystal semiconductor layer can be grown directly or via a buffer layer on a metal layer constituting an electrode, and therefore the present invention can be particularly advantageously applied to the manufacture of a semiconductor device formed by a basic material such as gallium nitride which could not be obtained in the form of a wafer. It should be noted that the method according to the present invention could be applied not only to the light emitting semiconductor device such as semiconductor laser and light emitting diode, but also to other kinds of semiconductor devices including the metal-semiconductor layered structure such as solar cell and photo-detector. Furthermore, according to the invention, the semiconductor layer may be epitaxially grown by various kinds of epitaxially growing methods such as metalorganic vapor phase epitaxy (MOVPE), liquid-phase epitaxy (LPE), chemical vapor deposition (CVD) and molecular beam epitaxy (MOE).

In a preferable embodiment of the method of forming an epitaxially grown semiconductor layer on a metal layer according to the invention, an electrically insulating substrate is formed by a sapphire substrate, a platinum (Pt) layer is epitaxially grown on a c-face (0001) of the sapphire substrate in a direction of crystal orientation of (111), a semiconductor layer made of a nitride of III-group semiconductor material is formed on the platinum layer by the epitaxial growth. The inventors have conducted various experiments using sapphire substrates and have found that by depositing a platinum layer in the crystal orientation (111) on the c-face of the sapphire substrate by means of sputtering, it is possible to form an epitaxially grown metal layer, i.e. single crystal platinum layer having a uniform crystal orientation. A reason of such a phenomenon will be considered as follows. Since the thickness of a layer deposited during the sputtering process can be easily controlled, atoms or molecules of platinum can be deposited at a relatively slow rate by finding stable sites of the sapphire substrate or platinum layer. From this view point, according to the invention, the metal layer may be formed by other depositing method such as a liquid-phase epitaxial growth method in which the epitaxial deposition is performed in a much more equilibrium and thermally stable manner. Based on such a recognition, in a preferable embodiment of the method according to the invention, a platinum layer is deposited in the direction of crystal orientation (111) on the c-face of the sapphire substrate by sputtering.

During the sputtering process for depositing the platinum layer, it is preferable to keep the sapphire substrate at a temperature within a range from 400° C. to 700° C. It has been found experimentally that an epitaxially grown platinum layer having better crystalline property is deposited by sputtering, while the sapphire substrate is heated to a temperature from 400° C. to 700° C. Particularly, when the sapphire substrate is heated to about 500° C. during the sputtering, it has been found that a platinum layer having a particularly small variation in the crystal orientation can be formed. It should be noted that the sputtering process may be carried out by D.C. sputtering, magnetron sputtering, reactive sputtering and so on.

In a preferable embodiment of the method according to the invention, after growing the platinum epitaxial layer, an assembly is annealed within an inert gas atmosphere at a temperature within a range from 600° C. to 900° C., and then a semiconductor layer is epitaxially grown on the thus annealed surface. By conducting the annealing process, the surface of the epitaxially grown platinum layer can be further flattened. Furthermore, the annealing process can prevent a formation of an alloy of platinum and semiconductor. If the annealing process is performed at a temperature not lower than 900° C., the platinum layer might be pealed off the sapphire substrate. However, if the annealing temperature is not higher than 600° C., the flattening could not be effected sufficiently. Therefore, it is preferable that the annealing process is performed at a temperature within a range from 600° C. to 900° C.

In another preferable embodiment of the method according to the invention, the step of epitaxially growing a semiconductor layer includes a first low temperature epitaxial growth and a second high temperature epitaxial growth. Upon forming a metal layer on a semiconductor layer by the epitaxial growth, there might be produced an undesired alloy layer at a boundary therebetween. By performing the two-step epitaxial growth at low and high temperature, it is possible to prevent the formation of such an alloy layer. During the first low temperature epitaxial growth, the substrate is heated at a temperature of about 600° C., and during the second high temperature epitaxial growth, the substrate is heated at a temperature of about 1000° C. By selecting such temperatures, the formation of alloy can be effectively prevented.

In a preferable embodiment of the method according to the invention, a gallium nitride layer is formed on a platinum layer. In such an embodiment, it is advantageous to provide a buffer layer between the platinum layer and the gallium nitride layer for preventing the formation of alloy. The buffer layer may be formed by a gallium nitride layer or aluminum nitride layer deposited at a relatively low temperature such as 500–800° C. According to the invention, the buffer layer may be preferably made of a material which hardly produces alloy together with the underlying platinum layer and also has a lattice constant which does not deviate from that of the gallium nitride too much.

According to the invention, a light emitting semiconductor device comprises:

an electrically insulating substrate having a single crystal structure and having a surface;

a first metal layer epitaxially grown on said surface of the substrate, said first metal layer constituting a first electrode of the semiconductor device;

a first cladding layer formed by a semiconductor material having a first conductivity type and being epitaxially grown on said surface of the substrate;

an active layer formed on said first cladding layer;

a second cladding layer formed by a semiconductor layer having a second conductivity type opposite to said first conductivity type and formed on said active layer; and a second metal layer formed on said second cladding layer, said second metal layer constituting a second electrode of the semiconductor device.

In the light emitting semiconductor device according to the invention, the first metal layer constituting the first electrode is formed on the insulating substrate, and the remaining layers are successively formed on said first metal layer. Therefore, carriers can travel from the electrode to the active layer along a short travelling path length. In this manner, according to the invention, it is possible to realize a semiconductor laser and light emitting diode (LED) having a lower power consumption and a deceased In a preferable embodiment of the light emitting semiconductor device according to the invention, said electrically insulating substrate is made of sapphire, said first metal layer is formed by a platinum layer formed on the c-face of the sapphire in the crystal orientation of (111), and said first and second cladding layers are formed by gallium nitride layers deposited by the metalorganic vapor phase epitaxy.

DESCRIPTION OF THE PREFERRED EMBODIMENT

Figure 1:
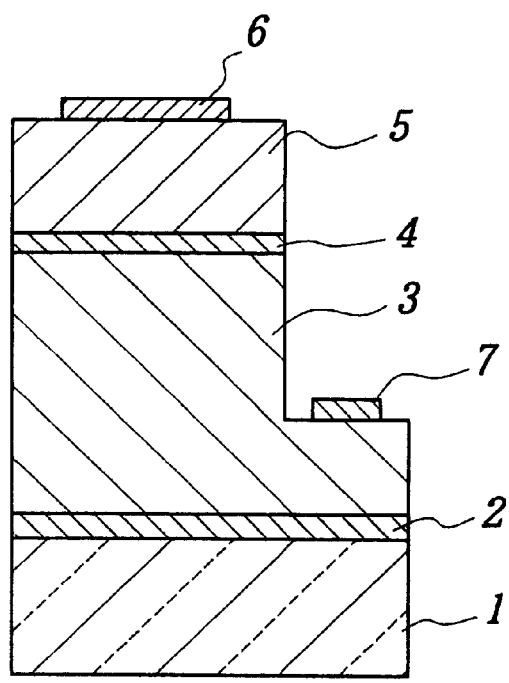
FIG. 1 is a cross sectional view showing schematically a known semiconductor laser.
Figure 2:
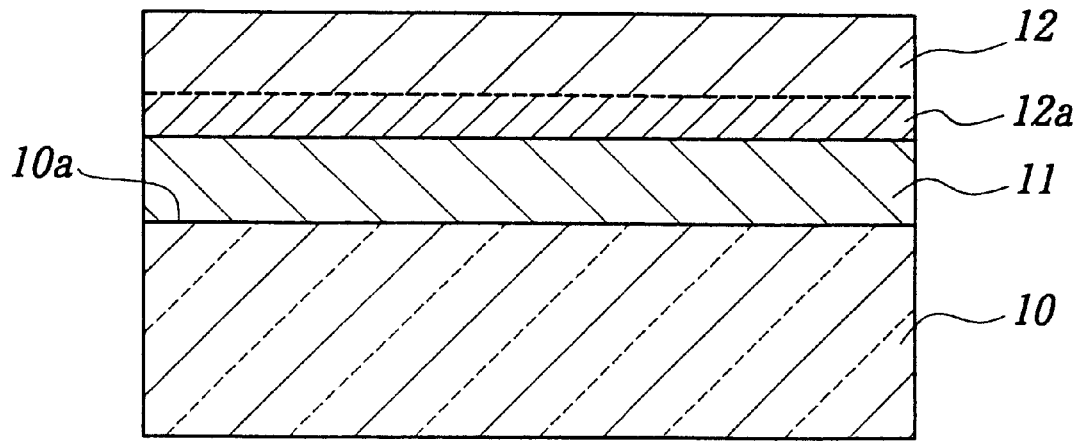
FIG. 2 is a cross sectional view illustrating schematically a metal-semiconductor layered structure for explaining the formation of a single crystal semiconductor layer on a metal layer according to the invention.

FIG. 2 is a schematic cross sectional view showing an embodiment of the method of forming a single crystal semiconductor layer on a metal layer according to the invention. In the present embodiment, the layer structure of a semiconductor laser is mainly consisting of gallium nitride. A sapphire substrate 10 is used as an electrically insulating substrate having a single crystal structure. A surface 10a of the sapphire 10a, and metal layers and semiconductor layers are successively deposited on this surface 10a. In the present embodiment, the surface 10a is formed by a c-face. As usually, the c-face may be denoted by (0001). The surface 10a of the sapphire substrate 10 may be processed by the mirror plane polishing or may be subjected to a super flattening treatment by a high temperature annealing. In either case, a metal layer may be epitaxially grown on the thus processed surface 10a of the sapphire substrate 10.

On the surface 10a of the sapphire substrate 10, is deposited a metal layer 11 which constitutes an electrode of the semiconductor laser. In the present embodiment, a platinum layer 11 is deposited by a sputtering process along a direction of crystal orientation (111). Then, it is possible to obtain the platinum layer 11 having a uniform crystal orientation. The platinum layer 11 may have a thickness of, for instance 100–1000 Å. The epitaxially grown metal layer maybe formed by any other depositing method than the sputtering, in which the metal layer can be formed to have a uniform crystal orientation. For instance, the metal layer may be formed by the LPE (liquid-phase epitaxy). It should be noted that the metal layer 11 has to be made of a metal which has a suitable work function such that an ohmic electrode can be obtained for the semiconductor layer which will be formed on the metal layer.

Next, an annealing process is carried out at a high temperature under an inert gas atmosphere to flatten the surface of the platinum layer 11. By performing the annealing, a formation of alloy between the platinum layer 11 and the semiconductor layer to be formed on the platinum layer can be effectively prevented. The annealing may be conducted at a temperature within a range from 600° C. to 900° C.

Next, a gallium nitride layer 12 is formed on the platinum layer 11 by means of the metalorganic vapor phase epitaxy (MOVPE). The formation of the gallium nitride layer 12 may be performed by a single step while temperature and growing conditions are kept constant from the beginning of the growth or may be conducted by two steps, i.e. a first low temperature epitaxial growing step and a second high temperature epitaxial growing step. Alternatively, epitaxial growing conditions may be varied continuously. For instance, the temperature may be increased continuously during the epitaxial growth.

In the present embodiment, the gallium nitride layer 12 is formed by the low temperature epitaxial growth and high temperature epitaxial growth. That is to say, a buffer layer 12a is first formed by the low temperature epitaxial growth. The buffer layer 12a is effective for mitigating a large difference in lattice constant between the under-lying metal layer and the semiconductor layer. Furthermore, the buffer layer 12a can effectively serve to prevent the formation of alloy between the underlying platinum layer 11 and the gallium nitride layer 12.

In the present embodiment, the buffer layer 12a is made of GaN and formed by MOVPE using a trimetbylgallium (TMGa) as a raw material gas under the following conditions:

supply rate of TMGa: $2.86 \times 10^{-6}$ mole/min
flow amount of TMGa: 1.3 ccm
flow amount of $H_2$ (MO): 500 ccm
flow amount of $H_2$ ($NH_3$): 500–1250 ccm
supply rate of $NH_3$: $1.12$–$4.46 \times 10^{-2}$ mol/min
flow amount of $NH_3$: 250–1000 ccm
V/III ratio: 4000–15000
substrate temperature: 600° C.

The buffer layer 12a may be made of AlN instead of GaN. In this case, the buffer layer 12a made of AlN may be formed by MOVPE using a trimethylaluminum (TMAl) gas as a raw material gas under the following conditions:

supply rate of TMAl: $2.45$-$4.9 \times 10^{-6}$ mole/min
flow amount of TMAl: 5–10 ccm
flow amount of $H_2$ (MO): 500 ccm
flow amount of $H_2$ ($NH_3$): 1430–500 ccm
supply rate of $NH_3$: $0.31$–$4.46 \times 10^{-2}$ mol/min
flow amount of $NH_3$: 70–1000 ccm
V/III ratio: 1100–1800
substrate temperature: 500–800° C.

Next, a gallium nitride layer 12 is epitaxially grown on the buffer layer 12a by means of the same metalorganic vapor phase epitaxy apparatus. The gallium nitride layer 12 may be formed under the following conditions:

supply rate of TMGa: $2.86 \times 10^{-6}$ mole/min
flow amount of TMGa: 1.3 ccm
flow amount of $H_2$ (MO): 500 ccm
flow amount of $H_2$ ($NH_3$): 750 ccm
supply rate of $NH_3$: $3.35 \times 10^{-2}$ mol/min
flow amount of $NH_3$: 750 ccm
V/III ratio: 12000
substrate temperature: 1040° C.

After that, an annealing is carried out at about 900° C. to flatten the surface of the gallium nitride layer 12. This flattening process is particularly effective when the epitaxially grown gallium nitride layer 12 does not have a flat surface.

Figure 3:
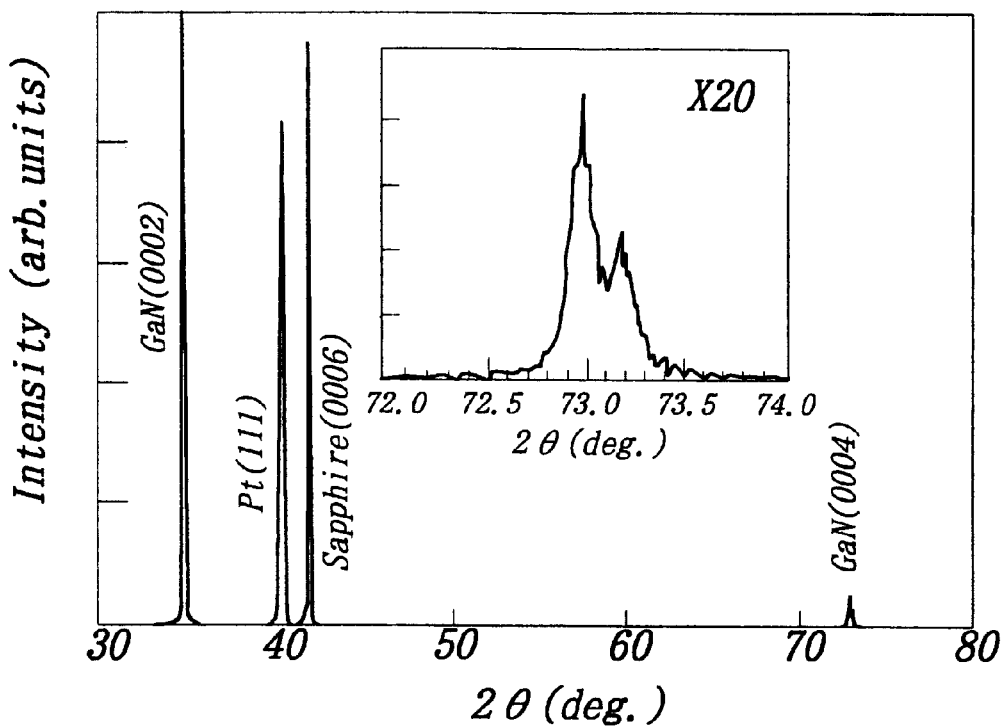
FIG. 3 is a graph representing an X-ray diffraction pattern of a sample formed by the method according to the invention.

In order to confirm whether or not single crystal gallium nitride layers are formed on the platinum layer, several samples of the metal-semiconductor layered structure were formed by the above mentioned method. The samples were manufactured under the following conditions:

(1) electrically insulating substrate
  material: sapphire
  metal depositing surface: c-face
(2) platinum layer
  thickness: 100 nm
  crystal orientation: (111) direction
  forming process: DC sputtering (Ar gas: 20 sccm, pressure: 1 mTorr)
(3) gallium nitride layer
  The gallium nitride layer is formed by the two steps, i.e. low temperature epitaxial growth to form the buffer layer, and high temperature epitaxial growth.
  (low temperature epitaxial growth)
thickness: 20 nm
supply rate of TMGa: $2.86 \times 10^{-6}$ mole/min
flow amount of TMGa: 1.3 ccm
flow amount of $H_2$ (MO): 500 ccm
flow amount of $H_2$ ($NH_3$): 1250 ccm
supply rate of $NH_3$: $1.12$–$4.46 \times 10^{-2}$ mol/min
flow amount of $NH_3$: 250 ccm
V/III ratio: 4000–15000
substrate temperature: 600° C.
  (high temperature epitaxial growth)
thickness: 1.2 $\mu$m supply rate of TMGa: $2.86 \times 10^{-6}$ mole/min
flow amount of TMGa: 1.3 ccm
flow amount of $H_2$ (MO): 500 ccm
flow amount of $H_2$ ($NH_3$): 750 ccm
supply rate of $NH_3$: $3.35 \times 10^{-2}$ mol/min
flow amount of $NH_3$: 750 ccm
V/III ratio: 12000
substrate temperature: 1040° C.
deposition time: 60 minutes FIG. 3 is a graph showing an X-ray diffraction pattern of a sample formed in the above explained manner. As can be understood clearly, in addition to diffraction peaks corresponding to the c-face of the sapphire substrate and the (111) plane of the platinum layer, only a peak representing the gallium nitride growing in the direction of the c-axis. Separation of diffraction peaks for two X rays generated from copper (Cu $K\alpha_1$ and $K\alpha_2$) is recognized for diffraction from the GaN (0004) surface. From this X-ray diffraction experiment, it has been confirmed that the epitaxially grown platinum layer and epitaxially grown gallium nitride layer are formed on the sapphire substrate.

Figure 4:
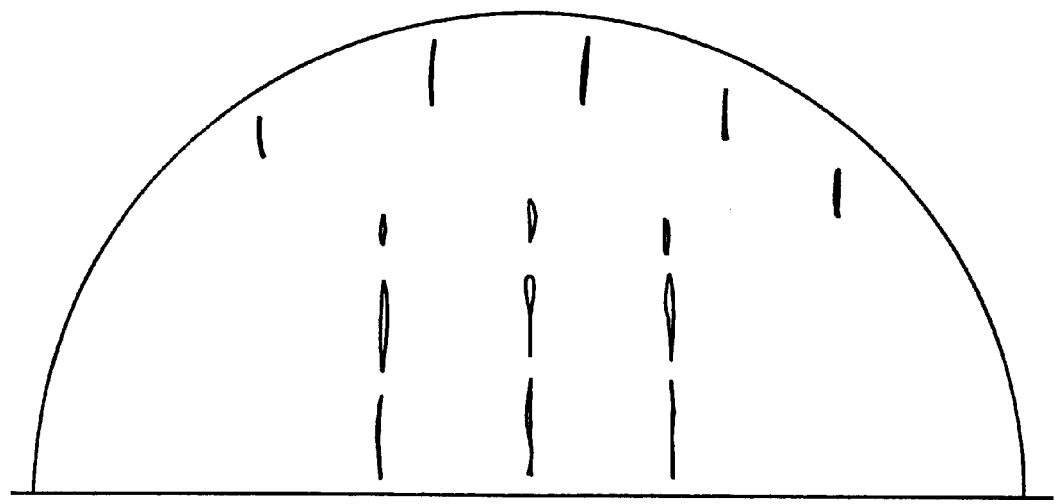
FIG. 4 is a schematic view denoting an electron beam diffraction pattern of a sample manufactured by the method according to the invention.

FIG. 4 is a schematic view illustrating a photograph of an electron beam diffraction image obtained by the electron beam diffraction pattern. Streak-like diffraction patterns for (11–20) incident electron beam are clearly observed. Also from this electron beam diffraction, it has been confirmed that the single crystal gallium nitride layer is formed on the platinum layer.

Figure 5:
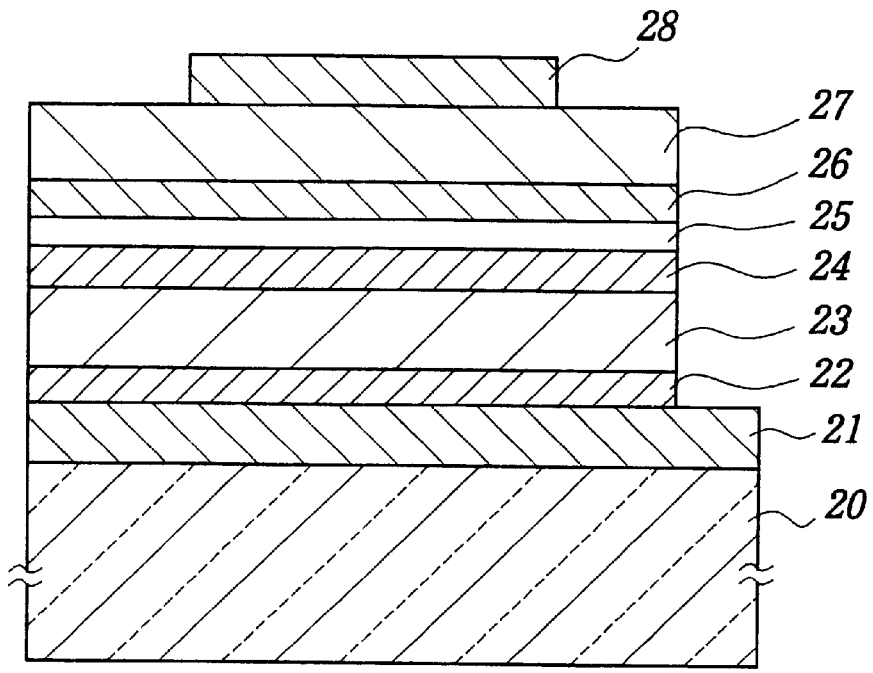
FIG. 5 is a cross sectional view showing schematically an embodiment of the semiconductor laser formed by the method according to the invention.

Now a semiconductor laser having the metal-semiconductor layered structure formed by the method according to the invention will be explained with reference to FIG. 5. An electrically insulating substrate 20 is made of sapphire having the c-face. On this c-face of the sapphire substrate 20 is formed a platinum layer 21 which serves as a first electrode. The platinum layer 21 is formed by the epitaxial growth with a thickness of 500–2000 Å. On the platinum layer 21, there are successively formed semiconductor layers constituting the semiconductor laser by means of the metalorganic vapor phase epitaxy. At first, a buffer layer 22 made of GaN is formed on the platinum layer 21 by MOVPE using a trimethylgallium gas as a raw material gas with a thickness of, for instance 100–500 Å. Then, a p-GaN layer 23 is epitaxially deposited on the buffer layer 22, said p-GaN layer serving as a p-type cladding layer. The p-GaN layer 23 includes Mg as dopant with a density of $2 \times 10^{20}$ atoms/$cm^3$. The p-GaN layer 23 has a thickness of 0.2–0.5 μm. On the p-GaN layer 23, is formed a p-type composition modifying layer 24. In the present embodiment, the composition modifying layer 24 is formed by three layers, i.e. p-$Al_{0.2}Ga_{0.8}$N:Mg-p-GaN:Mg-p-$Al_{0.7}Ga_{0.3}$N:Mg. On the p-type composition modifying layer 24 is formed an active layer 25. The active layer 25 may be formed by, for instance a multiple quantum well structure of InGaN.

On the active layer 25 is formed an n-type composition modifying layer 26 including Si dopant. The n-type composition modifying layer 26 is formed by three layers, i.e. n-$In_{0.05}Ga_{0.95}$N:Si-n-$Al_{0.07}Ga_{0.93}$N:Si-n-GaN:Si. On the n-type composition alering layer 26 is formed an n-type GaN layer 27 serving as a cladding layer. The GaN layer 27 has a thickness of 0.2–0.5 μm and has an impurity concentration of $2 \times 10^{19}$ atoms/$cm^3$. On the n-type GaN layer 27 is further formed a second metal layer 28 constituting a p-electrode. The second electrode 28 may be formed by a Ni or Al layer.

Figure 6:
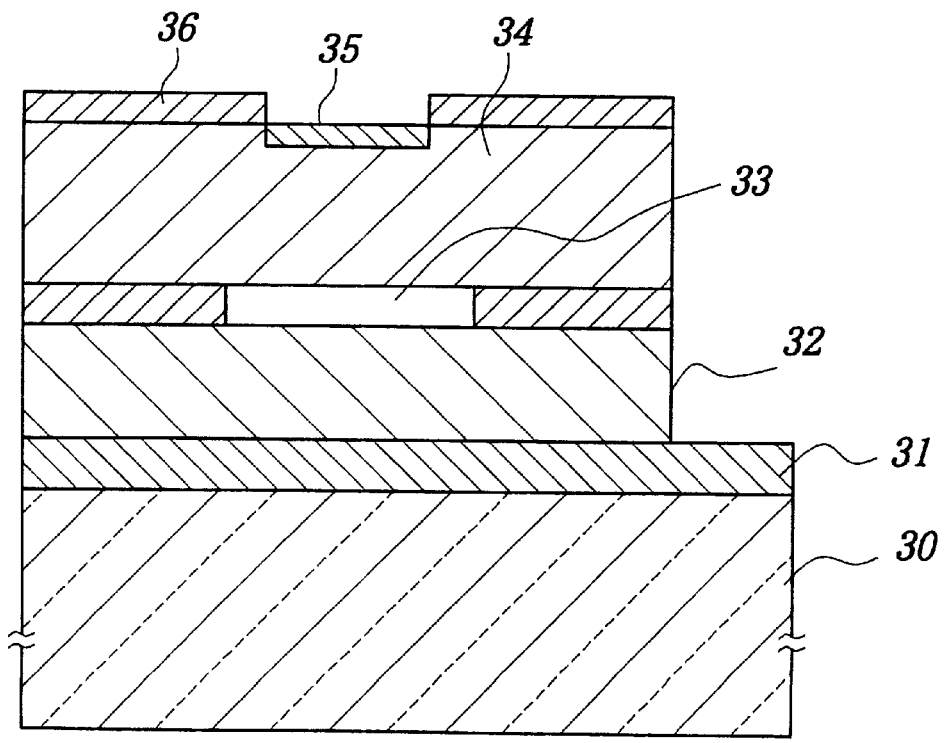
FIG. 6 is a cross sectional view depicting an embodiment of the surface emitting laser manufactured by the method according to the invention.

FIG. 6 is a schematic cross sectional view showing a surface emitting laser manufactured by the method according to the invention. The surface emitting laser per se has been well known and has been widely used. Therefore, only a portion thereof relating to the present invention will be explained. On a sapphire substrate 30 is formed a platinum layer 31 which serves as an electrode as well as a reflection mirror. On the platinum layer 31 is epitaxially grown a first cladding layer 32 made of GaN, and on the first cladding layer is formed an active region 33. On the active region 33 is formed a second cladding layer 34 made of n-type GaN. A second reflection mirror 35 is formed on a portion of the second cladding layer 34 corresponding to the active layer 33. Further, a second electrode 36 is formed on the second cladding layer 32 to enclose the second reflection mirror 35. The second electrode 36 is consisting of Ni layer and Al layer. In the present surface emitting laser, the semiconductor layers can be directly formed on the platinum layer which has been previously formed on the sapphire substrate. Therefore, the manufacturing process becomes easy and efficient.

What is claimed is:

1. A method of forming a single crystal semiconductor layer on a metal layer, said method comprising the steps of:
   preparing an electrically insulating substrate having a single crystal structure;
   forming an epitaxially grown metal layer on a surface of said electrically insulating substrate; and
   forming an epitaxially grown semiconductor layer on a surface of said metal layer, wherein said eletrically insulating substrate is formed by a sapphire substrate having a c-face, and a platinum layer is epitaxially arown on the c-face of the sapphire substrate in a direction of crystal orientation of (111), and a III-group nitride semiconductor laver is epitaxially grown on the platinum surface.

2. A method according to claim 1, wherein said platinum layer is epitaxially deposited by sputtering.

3. A method according to claim 2, wherein said platinum layer is formed to have a thickness of 100–2000 Å.

4. A method according to claim 3, wherein during the formation of the platinum layer by sputtering, the sapphire substrate is heated at a temperature within a range from 400° C. to 700° C.

5. A method according to claim 4, wherein said sapphire substrate is heated at a temperature of about 500° C.

6. A method according to claim 1, wherein after forming said platinum layer, an annealing process is carried out at a temperature within a range from 600° C. to 900° C. under an inert gas atmosphere, and then said III-group nitride semiconductor layer is epitaxially grown on the platinum layer.

7. A method according to claim 1, wherein said step of epitaxially growing the III-group nitride semiconductor layer is performed by successively conducting a first low temperature epitaxial growth and a second high temperature epitaxial growth.

8. A method according to claim 7, wherein during said first low temperature epitaxial growing step, the sapphire substrate is kept at a temperature of about 600° C., and during said second high temperature epitaxial growing step, the sapphire substrate is kept at a temperature of about 1000° C.

9. A method according to claim 1, wherein said step of epitaxially growing the III-group nitride semiconductor layer on the platinum layer is performed by epitaxially growing a single crystal gallium nitride layer by metalorganic vapor phase epitaxy.

10. A method of forming aasingle crystal semiconductor layer on a metal layer comprising the steps of:
   preparing a sapphire substrate having a c-face;

depositing an epitaxially grown platinum layer on said c-face of the sapphire substrate in a direction (111) by sputtering; and depositing a single crystal gallium nitride layer on said platinum layer by epitaxial growth.

11. A method according to claim 10, wherein said step of depositing the single crystal gallium nitride layer includes a step of forming a first single crystal gallium nitride layer having a first thickness by keeping the sapphire substrate at a first temperature, and a step of forming second single crystal gallium nitride layer having a second thickness which is thicker than said first thickness by keeping the sapphire substrate at a second temperature higher than said first temperature.

12. A method according to claim 11, wherein said first temperature is set to about 600° C. and said second temperature is set to about 1000° C.

13. A method according to claim 12, wherein said first thickness is set to about 100–500 Å and said second thickness is set to be not less than 0.2 μm.

14. A method according to claim 13, wherein said first and second gallium nitride layers are deposited by metalorganic vapor phase epitaxy.

15. A method according to claim 10, wherein after forming said platinum layer, an annealing process is carried out at a temperature within a range from 600° C. to 900° C. under an inert gas atmosphere.

16. A method according to claim 11, wherein said platinum layer is formed with a thickness of 500–2000 Å.

* * * * *